United States Patent
Jeong et al.

(10) Patent No.: US 12,243,609 B2
(45) Date of Patent: Mar. 4, 2025

(54) NON-VOLATILE MEMORY OCTO MODE PROGRAM AND ERASE OPERATION METHOD WITH REDUCED TEST TIME

(71) Applicant: SK keyfoundry Inc., Cheongju-si (KR)

(72) Inventors: Weon-Hwa Jeong, Seoul (KR); Young Chul Seo, Gwangmyeong-si (KR); Chul Geun Lim, Gunsan-si (KR); Yong Hwan Kim, Cheongju-si (KR); Sung Bum Park, Seongnam-si (KR); Kee Sik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 445 days.

(21) Appl. No.: 17/538,011

(22) Filed: Nov. 30, 2021

(65) Prior Publication Data
US 2023/0087413 A1   Mar. 23, 2023

(30) Foreign Application Priority Data
Sep. 17, 2021   (KR) .................. 10-2021-0124778

(51) Int. Cl.
| G11C 29/50 | (2006.01) |
| G11C 16/08 | (2006.01) |
| G11C 16/10 | (2006.01) |
| G11C 16/16 | (2006.01) |

(52) U.S. Cl.
CPC ........ *G11C 29/50012* (2013.01); *G11C 16/08* (2013.01); *G11C 16/10* (2013.01); *G11C 16/16* (2013.01)

(58) Field of Classification Search
CPC ... G11C 29/50012; G11C 16/08; G11C 16/10; G11C 16/16; G11C 11/14; G11C 11/165; G11C 11/1673; G11C 11/1675

USPC ...................................................... 365/185.18
See application file for complete search history.

(56) References Cited

U.S. PATENT DOCUMENTS

| 5,949,731 A * | 9/1999 | Tsukude | G11C 29/50 |
| | | | 365/230.01 |
| 6,556,725 B1 * | 4/2003 | Kondo | G06T 3/606 |
| | | | 382/296 |
| 7,889,592 B2 | 2/2011 | Kim | |
| 8,923,049 B2 | 12/2014 | Lee et al. | |
| 9,336,902 B2 | 5/2016 | Jeong | |
| 9,666,291 B2 | 5/2017 | Park | |
| 11,682,440 B2 * | 6/2023 | Nien | G11C 11/412 |
| | | | 365/230.06 |
| 2006/0164898 A1 * | 7/2006 | Pio | G11C 29/026 |
| | | | 365/210.1 |
| 2011/0044113 A1 * | 2/2011 | Kim | G11C 16/12 |
| | | | 365/185.18 |
| 2023/0082379 A1 * | 3/2023 | Seo | G11C 16/10 |
| | | | 365/185.21 |

* cited by examiner

*Primary Examiner* — Connie C Yoha
(74) *Attorney, Agent, or Firm* — NSIP Law

(57) ABSTRACT

An octo mode program and erase operation method to reduce test time in a non-volatile memory device. M/8 word lines corresponding to an octo row, among M word lines, are simultaneously selected, and a write voltage is applied to memory cells connected to M/8 word lines corresponding to the octo row. A voltage that is different from the write voltage is applied to memory cells connected to the rest of word lines, except for M/8 word lines corresponding to the octo row, when the octo signal is applied to an address decoder.

15 Claims, 4 Drawing Sheets

NON-VOLATILE MEMORY OCTO MODE PROGRAM AND ERASE OPERATION METHOD WITH REDUCED TEST TIME

CROSS-REFERENCE TO RELATED APPLICATIONS

This application claims the benefit under 35 U.S.C. § 119 of Korean Patent Application No. 10-2021-0124778 filed on Sep. 17, 2021, in the Korean Intellectual Property Office, the entire disclosure of which is incorporated herein by reference for all purposes.

BACKGROUND

1. Field

The following description relates to an octo mode program and erase operation method for test time reduction in a non-volatile memory device.

2. Description of Related Art

A semiconductor device including a non-volatile memory cell (a non-volatile memory device) may be implemented in various application fields such as, but not limited to, a controller integrated circuit (IC), a Radio Frequency Identification (RFID) Tag, a Microcontroller unit (MCU), Touch, etc. because data saved in a memory cell may not be lost even if a power is lost, and its importance is growing. A FLASH memory device and an Electrical Erasable Programmable Read Only Memory (EEPROM) device are known as a typical semiconductor device including a non-volatile memory device.

In a non-volatile memory (NVM), a shorted fail may occur in an adjacent word line (WL) based on a metal particle and a poly residue. In this example, all word lines should be tested, and a considerable amount of time may be needed for the testing process. In an example, when there are 512 word lines, and the time to test a word line is 2.5 ms, a total testing time may be 512*2.5 ms=1280 ms. The longer a test time or test period is, the larger a requisite cost for testing becomes. Therefore, it is desirable that the test time is shortened.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a non-volatile memory device includes a memory cell array comprising M word lines and N bit lines; a control logic device, configured to receive an external signal, and output an octo signal, a program signal and an erase signal; an address decoder, configured to receive the octo signal, and output a word line selection signal and a bit line selection signal; a high voltage generator, configured to receive the program signal and the erase signal, and output a read voltage and a write voltage; a row decoder, configured to receive the word line selection signal, and select a word line of the memory cell array; a column decoder, configured to receive the bit line selection signal, and select a bit line of the memory cell array; a page buffer, configured to receive the read voltage and the write voltage, and save data to be programmed; and a data latch, configured to save read data obtained from a read operation; wherein the non-volatile memory device is configured to simultaneously select M/8 word lines corresponding to an octo row, among the M word lines, when the octo signal is applied to the address decoder, wherein a write voltage is applied to memory cells connected to M/8 word lines corresponding to the octo row, and wherein a voltage that is different from the write voltage is applied to memory cells connected to word lines, except for the M/8 word lines corresponding to the octo row.

The data latch may be further configured to receive write data, and output read data.

The non-volatile memory device may be configured to perform a write operation of a FN tunneling method.

The non-volatile memory device may be configured to be implemented in circuit technology that reduces a test time for a shorted fail sample due to a metal particle, and to screen the shorted fail sample.

The memory cell array may include a 64 KB EEPROM which has 512ea word lines.

The control logic device may be further configured to generate a hexa signal to select a word line by 16ea among a plurality of word lines of the memory cell array.

The hexa signal may be a $\frac{1}{16}$ signal.

The control logic device may be further configured to generate a $\frac{1}{32}$ signal to select a word line by 32ea among a plurality of word lines of the memory cell array.

In a general aspect, a non-volatile memory device test time reduction method includes transmitting an octo signal from a control logic device to an address decoder; transmitting the octo signal from the address decoder to a row decoder; transmitting the octo signal from the row decoder to a memory cell array; selecting, based on the octo signal, M/8 word lines simultaneously corresponding to an octo row, among M word lines of the memory cell array; and performing a write operation simultaneously in memory cells connected to the M/8 word lines corresponding to the octo row.

The method may include delivering a write signal from the control logic device to a high voltage generator.

The method may include supplying a write voltage from the high voltage generator to the memory cell array.

The write operation may be performed by supplying the write voltage to a memory cell connected to M/8 word lines corresponding to the octo row.

A voltage that is different from the write voltage may be applied to a memory cell that is not connected to M/8 word lines corresponding to the octo row.

The write operation may include an octo array erase mode, and the octo array erase mode may be controlled by a write enable signal (WEB) and an erase enable signal (ERSB) supplied from the control logic device.

The write operation may include an octo array program mode, and the octo array program mode may be controlled by a write enable signal (WEB) and a program enable signal (PGMB) supplied from the control logic device.

In a general aspect, a non-volatile memory device includes a memory cell array comprising M word lines and N bit lines; a control logic device, configured to output an octo signal, a program signal, and an erase signal; an address decoder, configured to receive the octo signal, and output a word line selection signal and a bit line selection signal; and a high voltage generator, configured to receive the program signal and the erase signal, and output a read voltage and a write voltage; wherein the non-volatile memory device is configured to select M/8 word lines corresponding to an octo row, among the M word lines, based on a receipt of the octo signal in the address decoder.

The method may further include applying the write voltage to memory cells connected to the M/8 word lines corresponding to the octo row, and applying a voltage different from the write voltage to memory cells connected to word lines other than the M/8 word lines corresponding to the octo row.

Other features and aspects will be apparent from the following detailed description, the drawings, and the claims.

BRIEF DESCRIPTION OF DRAWINGS

FIGS. 4A to 4C illustrate diagrams of an implementation of an example erase operation based on an octo signal in a non-volatile memory device test method including an octo mode program and erase operation for a test time reduction, in accordance with one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
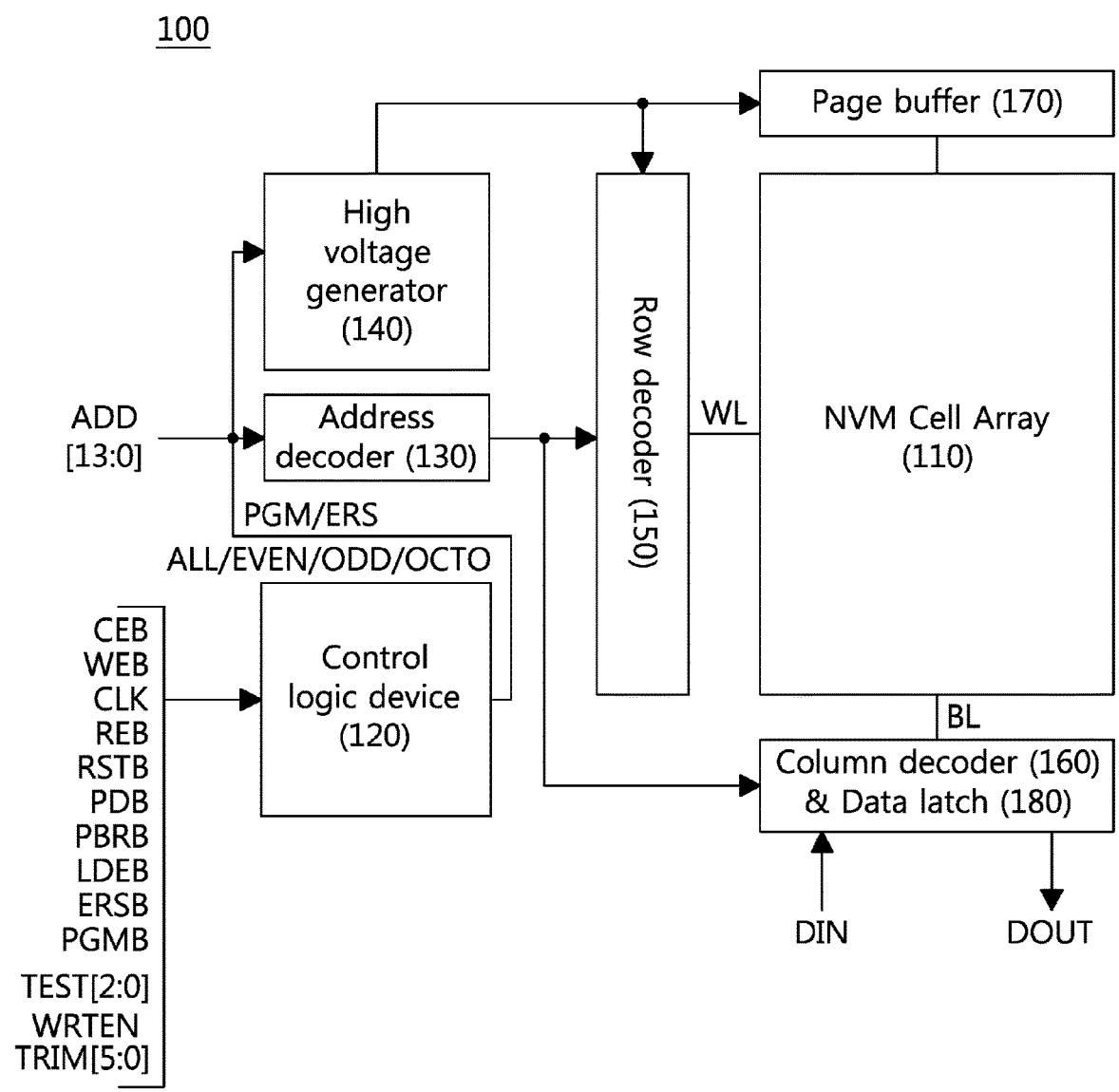
FIG. 1 illustrates each element of an example non-volatile memory device including an octo mode program and erase operation for a test time reduction and its organic combination in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure provides a method of an octo mode program and erase operation that may precisely screen a failed chip, where the failure is due, as an example, to a particle or a poly residue, and may reduce a test time in a non-volatile memory device.

A targeted problem of the disclosure is not limited by the problems which are mentioned above, and other problems may be understood by a person skilled in the relevant field of technology, from the following description.

A non-volatile memory device 100 including an octo mode program and erase operation for a test time reduction may be applied to a non-volatile memory device such as EEPROM (Electrically Erasable and Programmable ROM), flash memory, NAND flash memory, NOR flash memory, PRAM (Phase-change RAM), MRAM (Magnetic RAM), RRAM (Resistive RAM), FRAM (Ferroelectric RAM), etc., but it is not limited thereto.

Additionally, the octo mode program and erase operation may be applied to a memory system where different types of non-volatile memory devices are implemented. Moreover, technical features of the examples may be adopted in a storage device such as a Solid State Drive (SSD). The "octo" mode or "octo" signal may refer to the selection of word lines in multiples of 8.

Section 1:

<A Non-Volatile Memory Device Including an Octo Mode Program and Erase Operation for a Test Time Reduction>

A detailed description for the disclosure is given below, with attached drawings.

FIG. 1 illustrates each element of a non-volatile memory device including an octo mode program and erase operation for a test time reduction and its organic combination in accordance with one or more embodiments.

The examples relate to a high tech NVM memory implementing a program (PGM)/erase (ERS) operation of a FN tunneling method. Accordingly, a non-volatile memory device of the examples may perform a write operation of a FN tunneling method. The example also relates to a circuit technology that screens a fail sample to reduce a test time for a shorted fail sample of a word line (WL) due to a metal particle, etc. The examples relate to a circuit technology for an improved method since it may be difficult to do screening by a metal particle, etc. in a high tech environment.

Referring to FIG. 1, a non-volatile memory device 100 including an octo mode program and erase operation that reduces a non-volatile memory device test time, includes a memory cell array 110 including M word lines and N bit lines; a control logic device 120, that outputs an octo signal, a program signal and an erase signal based on the receipt of an external signal; an address decoder 130, that receives the octo signal output from the control logic 120, and outputs a word line selection signal and a bit line selection signal; a high voltage generator 140, that receives the program signal and the erase signal output from the control logic 120, and outputs a read voltage and a write voltage; a row decoder 150, that receives the word line selection signal, and selects a word line of the memory cell array 110; a column decoder 160, that receives the bit line selection signal, and selects a bit line of the memory cell array 110; a page buffer 170, that receives the read voltage and the write voltage, and saves data to be programmed; a data latch 180, that saves read data obtained on the basis of a read operation; and a write data input (DIN) and a read data output (DOUT). In the examples, the page buffer 170 may be referred to as a page program buffer.

Additionally, when the octo signal is applied to the address decoder 130, a non-volatile memory device of the examples may simultaneously select M/8 word lines corresponding to an octo row, among the M word lines. A write voltage may be applied to memory cells connected to M/8 word lines corresponding to the octo row, and a voltage that is different from the write voltage may be applied to memory cells connected to the rest of the word lines, except for M/8 word lines corresponding to the octo row.

An EEPROM device may be embedded in a memory cell array 110 including a plurality of memory cells in accordance with one or more examples. In an example, an EEPROM device having a 512 Kbit memory size with 512 rows*1024 columns may be included.

That is, a memory cell array including a plurality of memory cells of the examples may include 64 KB EEPROM having 512ea word lines.

When a control signal is received, a program (PGM)/erase (ERS) signal that controls a high voltage generator 140 of a memory cell, may be supplied to a control logic device 120 in accordance with one or more embodiments.

Various signals may be included in a control signal that is inputted in a control logic device 120 of the examples. Typically, there are signals received such as Chip Enable (CEB) (To enable IP block, Chip Enable, B means low active), Write Enable (WEB) (Write enable signal, B means low active), Clock (CLK) (Clock signal), Read Enable (REB) (Read enable signal), Reset (RSTB) (reset signal), Power Down (PDB) (Power down enable signal), Page Buffer (PBRB) (page buffer reset signal), Load enable (LDEB) (Load enable signal), Erase Enable ERSB (Erase enable signal, B means low active), Program Enable (PGMB) (Program enable signal, B means low active), TEST[2:0], Write Enable (WRTEN) (Write enable signal of a chip), TRIM[5:0], etc.

In an example, the control logic device 120 may supply signals such as ALL, EVEN, ODD, OCTO, etc., to control an address decoder 130. Among these signals, ALL, EVEN, ODD, and OCTO signals may control a word line (WL), which is an output of a row decoder 150, by providing those signals with an address decoder 130.

In an example, the control logic device 120 may further generate a hexa signal ($\frac{1}{16}$ signal) to select a word line by 16ea among a plurality of word lines of the memory cell array, besides ALL, EVEN, ODD, OCTO signals. In an example, the control logic may further generate a $\frac{1}{32}$ signal to select a word line by 32ea among a plurality of word lines of the memory cell array.

Accordingly, a word line (WL), which is an output of a row decoder 150, may be selected by ALL, EVEN, ODD, and OCTO signals. That is, a word line corresponding to all row, even row, odd row, and octo row (0, 8, 16, 24, 32, . . . , 504 row, etc.) may be selected. To reduce a program (PGM)/erase (ERS) test time in a PGM/ERS operation, by using ALL, EVEN, ODD, and OCTO signals, a program/erase (PGM/ERS) operation may be performed with a memory cell in all, even, odd, and octo mode.

Meanwhile, when a foreign substance (by product) such as a metal particle or a poly residue falls in a region of a row decoder 150, a shorted fail may occur between adjacent word lines. In this example, before providing a sample to a customer, a shorted fail has to be screened. The screening process may take an extended period of time when cells connected to a word line are tested in serial to detect a shorted fail. For example, 2.5 ms per word line*512ea word lines=1.28 sec may be desired. The calculation is assumed with 512 word lines and a test time of 2.5 ms per word line.

Accordingly, to reduce a test time, screening may be performed by a page program/erase test method of ALL, EVEN, ODD mode. In the ALL page program/erase test method, 2.5 ms/512=4.88 μs are desired because the ALL page program/erase test method may test all cells at once. The EVEN or ODD test method may simultaneously test word lines corresponding to even numbers or odd numbers. Therefore, a test time=2.5 ms*2ea/512ea=9.7 μs may be desired, and thus, a test time is reduced considerably as compared to typical cases.

However, when a size of a metal particle or poly residue is large, a fail sample may not be screened properly because it may not be screened by a program/erase (PGM/ERS) operation of the ALL, EVEN, ODD mode. During a process of testing the fail sample, an octo mode PGM/ERS operation may be used to perform the screening operation.

Each ⅛ WL may be selected by an octo signal in an octo mode PMG/ERS operation. When the number of a word line is 512, word lines corresponding to 0, 8, 16, 24, 32, . . . , 504 row may be selected. Therefore, for a 64 KB EEPROM having 512ea word lines (WL) structure, a total test time may be reduced to be 2.5 ms*8ea/512ea=39 μs. A test time may be considerably reduced from a typical 1.28 sec, resulting in reducing a test cost. When a fail sample appears as a shorted fail because a metal particle or a poly residue falls in a region of a row decoder 150, it may be possible to screen a fail sample. For a 64 KB EEPROM having 512ea WL through the implementation of an OCTO mode PGM/ERS operation, memory cells corresponding to 64ea WL may be erased or programmed simultaneously. An OCTO mode erase method of a non-volatile memory device (NVM memory) of the examples will be described in FIG. 4.

Signals of the ALL, EVEN, ODD, and OCTO modes, etc. may be generated by using a control signal of TEST<2:0> in a control logic device 120. In an OCTO ERS operation, 64ea word lines (WL) may be selected by an octo signal among 512ea word lines (WL), and a corresponding cell may be selected and erased simultaneously. In an OCTO PGM operation, 64ea word lines (WL) may be selected by an octo signal among 512ea word lines (WL), and a corresponding cell may be selected and programmed simultaneously.

The control logic device 120, in accordance with one or more examples may be implemented to control various operations of a non-volatile memory device including an octo mode program and erase operation for a test time reduction. Additionally, the control logic 120 may be operated based on a control signal received from an external source. The control logic device 120 of the examples may be connected to an address decoder 130, a high voltage generator 140, etc.

Additionally, the control logic device 120 of the examples may further generate a hexa signal (1/16 signal) to simultaneously select word lines in multiples of 16 among a plurality of word lines of a memory (NVM) cell array 110. Further, the control logic device 120 of the examples may further generate a 1/32 signal to simultaneously select word lines in multiples of 32 among a plurality of word lines of a memory cell array 110.

Still referring to FIG. 1, in order to control the high voltage generator 140, the control logic device 120 of the examples may deliver a program (PGM) signal and/or an erase (ERS) signal to the high voltage generator 140.

The address decoder 130 of the examples may decode an address signal (ADD) received from an external source and deliver the received address signal (ADD) to the row decoder 150 and/or the column decoder 160. Additionally, the address decoder 130 of the examples may deliver a decoded signal to select a word line (WL) and a bit line (BL) of the memory cell array 110 to the row decoder 150 and/or the column decoder 160.

In an example, the address decoder 130 of the examples may receive the ALL, ODD, EVEN, and/or OCTO signals from the control logic device 120.

The ALL signal may refer to a command signal to select all word lines (WL) when a program operation and an erase operation, etc., is performed.

The ODD signal may refer to a command signal to select odd-numbered word lines (WL) when a program operation and an erase operation, etc., is performed.

The EVEN signal may refer to a command signal to select even-numbered word lines (WL) when a program operation and an erase operation, etc., is performed.

The OCTO signal may refer to a command signal to simultaneously select word lines in multiples of 8 among a plurality of word lines of a memory cell array 110 when a program operation and an erase operation, etc., is performed. Word lines selected in multiples of 8 may be simultaneously programmed or erased.

In an example, the address decoder 130 may receive a hexa signal and 1/32 signal, etc. from the control logic device 120. A hexa signal may refer to a command signal to simultaneously select word lines in multiples of 16 among a plurality of word lines of the memory (NVM) cell array 110 when performing a program operation and an erase operation, etc. 1/32 signal may refer to a command signal to simultaneously select word lines in multiples of 32 among a plurality of word lines of a memory cell array 110 when performing a program operation and an erase operation, etc.

In an example, the address decoder 130 may include an address buffer that saves a received address (ADD) signal.

In an example, the high voltage generator 140 may generate a voltage supplied to a plurality of word lines and memory cells based on a control operation of the control logic device 120.

In an example, the high voltage generator 140 may receive a program signal and/or an erase signal from the control logic device 120.

The high voltage generator 140 may be connected to the memory cell array 110, the control logic device 120, the row decoder 150, etc. The high voltage generator 140 may receive power from an external source, for example, a power supply voltage (Vcc) and a ground voltage (Vss), etc. The high voltage generator 140 may generate voltages having various levels from a power supply voltage (Vcc) and a ground voltage (Vss), etc. based on a control of a control logic device 120. Voltages generated in the high voltage generator 140 may be delivered to the memory cell array 110, the row decoder 150, and the page buffer 170, etc. under a control of a control logic device 120.

That is, the high voltage generator 140 may generate various types of word line voltages that may be supplied to each word line and a voltage that may be supplied to a bulk (for example, a well region, HDNW, HPW) where memory cells are formed, according to a control of the control logic device 120. There may be a program voltage (Vpgm or VPP), a selection and unselection read voltage (Vrd, Vread), etc. for word line voltages that are supplied to each word line. The high voltage generator 140 may generate a source line voltage (Vssl, Vgsl) provided with source lines when performing a read operation and a program operation. Additionally, the high voltage generator 140 may generate an erase voltage (Vers) that may be supplied to a bulk, and may also be simultaneously supplied to a memory cell array 110, when an erase operation is performed. Various voltages are described that may be generated in the high voltage generator 140. However, the voltages are not limited thereto.

The row decoder 150 may select one or more cells among memory cells of the memory cell array 110 based on a received address (ADD) signal decoded from the address decoder 130. That is, the row decoder 150 may select one of the memory blocks of the memory cell array 110 by responding to an address signal. The row decoder 150 may select one of a plurality of word lines of a selected memory block.

Additionally, since the row decoder 150 may be connected to the high voltage generator 140 in addition to being connected to the address decoder 130, the row decoder 150 may receive a voltage that is generated in the high voltage generator 140. Further, the row decoder 150 may deliver a word line voltage to a word line of a selected memory block. When performing a program operation, the row decoder 150 may deliver a program voltage (Vpgm or VPP) to a selected WL.

The row decoder 150 may decode a row address. Additionally, the row decoder 150 may perform different types of access operations such as program (PGM), erase (ERS), read, write, etc. The row decoder 150 may simultaneously select word lines in multiples of 8 among a plurality of word lines of the memory cell array 110 based on an octo signal, when performing operations such as a program operation and an erase operation, etc. Further, the row decoder 150 may simultaneously select word lines in multiples of 2, 4, 16, 32, etc. among a plurality of word lines of the memory cell array 110, when performing a program operation and an erase operation, etc.

The column decoder 160 may select one of memory blocks of a memory cell array 110 according to an address (ADD) signal decoded from an address decoder 130. The column decoder 160 may select one of a plurality of bit lines (BL) of a selected memory block. The column decoder 160 may decode a column address. The column decoder 160 may deliver a decoded column address signal to a read unit and write unit (not shown), or the page buffer 170, etc.

The page buffer 170 may supply data desired in a program operation to the memory cell array 110, by a page unit or by a bit unit. The non-volatile memory device 100, including an octo mode program and erase operation with a reduced test time, may further include an input/output buffer (not shown). An input/output buffer may deliver write data that are inputted in a program operation to the page buffer 170. An input/output buffer may output read data externally in a read operation that is provided from the page buffer 170. An input/output buffer may deliver an inputted address or command to the control logic device 120 or to the row decoder 150.

The data latch 180 may include a sense amplifier (sense AMP, not shown). The data latch 180 may receive data saved in a memory cell that is selected in a read operation through a bit line. By comparing received data with read data generated by a reference voltage, the data latch 180 may output read data (DOUT) for a memory cell selected externally.

Section 2:
<A Test Method of a Non-Volatile Memory Device Including an Octo Mode Program and Erase Operation with Reduced Test Time>

In a test method of a non-volatile memory device including an octo mode program and erase operation with a reduced test time reduction, elements of a non-volatile memory device may be applied correspondingly to Section 1 above.

A test method of a non-volatile memory device including an octo mode program and erase operation for a test time reduction may relate to circuit technology that reduces a test time, and may screen a fail sample due to a metal particle, poly residue, etc. where an adjacent word line (WL) is shorted in a high tech non-volatile memory performing a program (PGM)/erase (ERS) operation of a FN tunneling method.

An example test method of a non-volatile memory device may include an octo mode program and erase operations for a test time reduction may include transmitting an octo signal from a control logic device 120 to an address decoder 130; transmitting the octo signal from the address decoder 130 to the row decoder 150; transmitting the octo signal from the row decoder 150 to the memory cell array 110; selecting M/8 word lines simultaneously corresponding to an octo row among M word lines of the memory cell array by the octo signal; and performing a write operation simultaneously in memory cells connected to M/8 word lines corresponding to the octo row.

In an example test method of a non-volatile memory device, the control logic device 120 may deliver a write signal to the high voltage generator 140.

In an example test method of a non-volatile memory device, the high voltage generator 140 may supply a write voltage to the memory cell array 110.

In an example test method of a non-volatile memory device, the write operation may be performed by supplying the write voltage to a memory cell connected to M/8 word lines corresponding to the octo row.

In an example test method of a non-volatile memory device, a voltage that is different from the write voltage may be applied to a memory cell that is not connected to M/8 word lines corresponding to the octo row.

In an example test method of a non-volatile memory device, the write operation may include an octo array erase mode, and the octo array erase mode may be controlled by a write enable signal (WEB) and an erase enable signal (ERSB) supplied from the control logic device 120.

In an example test method of a non-volatile memory device, the write operation may include an octo array program mode, and the octo array program mode may be controlled by a write enable signal (WEB) and a program enable signal (PGMB) supplied from the control logic device 120.

The address decoder 130 may receive an address signal from an external source, and may also receive an ALL signal, an ODD signal, an EVEN signal and/or an OCTO signal from the control logic device 120, and decode each of the received signals. The address decoder 130 may deliver the decoded address signal, the decoded ALL signal, the decoded ODD signal, the decoded EVEN signal, and/or the decoded OCTO signal to the row decoder 150. The address decoder 130 may receive a hexa signal and/or a ⅟32 signal from the control logic device 120, decode the received signal, and deliver a decoded hexa signal and/or a decoded ⅟32 signal to the row decoder 150.

An example test method may further include the high voltage generator 140 generating a voltage that is supplied to memory cells that are included in the memory cell array 110 and the plurality of word lines by the received program signal or erase signal.

The row decoder 150 may perform a program operation or an erase operation by selecting word lines simultaneously by 1ea, 2ea, 8ea (multiples of 8), 16ea (multiples of 16), 32ea (multiples of 32), etc. among a plurality of word lines of the memory cell array 110. Based on the generation of the voltage by the high voltage generator 140, a program operation or an erase operation of the memory cell array 110 by the row decoder 150 may be performed.

In an example test method of a non-volatile memory device including an octo mode program and erase operation for a test time reduction, a page program PGM/erase (ERS) operation may be performed to screen a fail sample that is not screened due to an effect of a particle or a poly residue larger than typical examples, or a layout arrangement of a row decoder, etc.

In an example, an example may be made with a 64 KB EEPROM having 512 word lines (WL) and 1024 columns. In an example, it may be assumed that the 64 KB EEPROM has 512 pages instead of 512 word lines. Therefore, when performing each page program (PGM)/erase (ERS) operation, by an octo signal delivered from the control logic device 120, the row decoder 150 may simultaneously select word lines in multiples of 8 among a plurality of word lines of the memory cell array 110.

Accordingly, it may be possible to screen a fail sample precisely and rapidly that is not screened due to an effect of a particle or a poly residue larger than typical examples, or a layout arrangement of a row decoder, etc. Additionally, compared with a typical test method of performing a program (PGM)/erase (ERS) operation by a page unit, a test time may be reduced over 85%.

Figure 2:
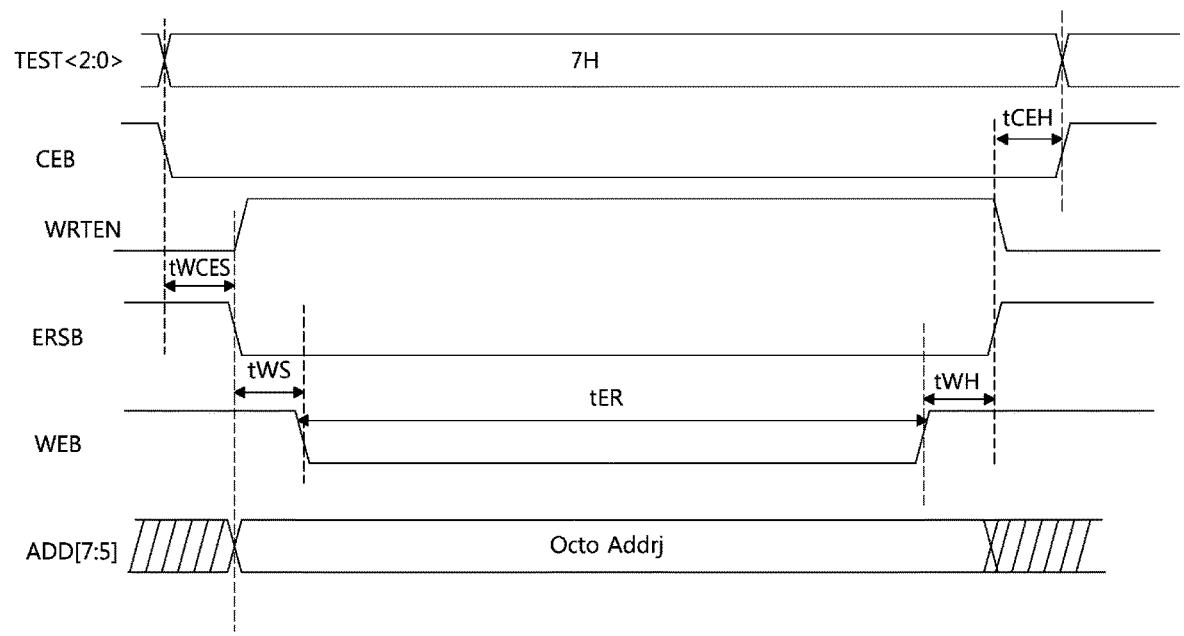
FIG. 2 illustrates an example process of performing an erase (ERS) operation based on an octo signal in an example non-volatile memory device test method including an octo mode program and erase operation for a test time reduction, in accordance with one or more embodiments.
Figure 3:
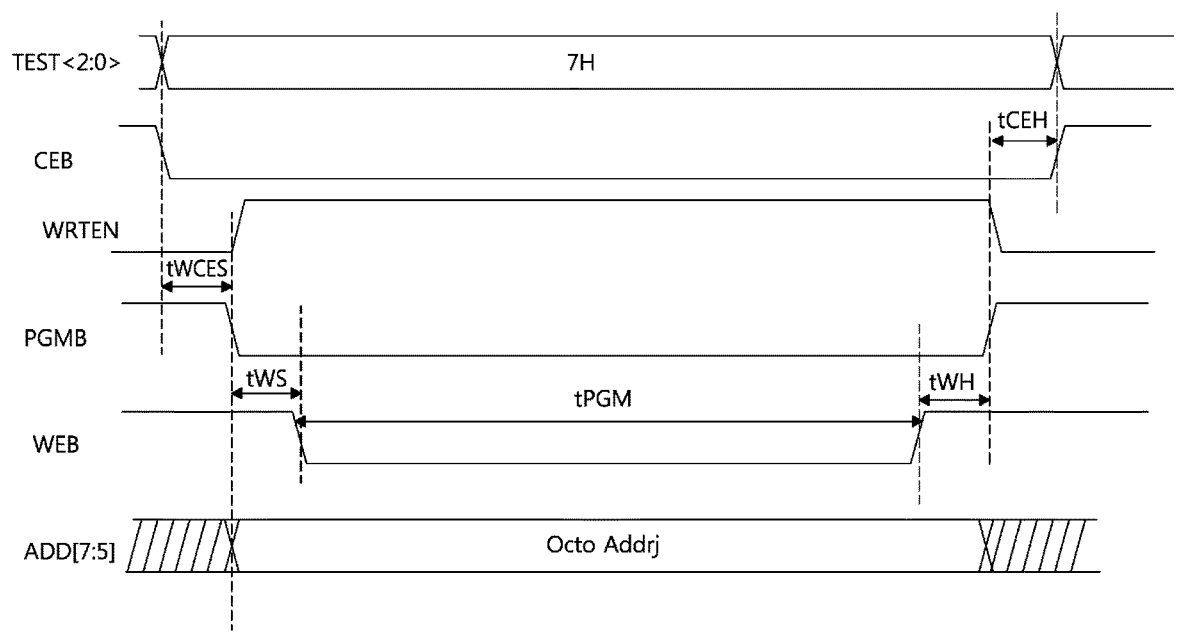
FIG. 3 illustrates an example process of performing a program (PGM) operation by an octo signal in an example non-volatile memory device test method including an octo mode program and erase operation for a test time reduction, in accordance with one or more embodiments.

FIG. 2 and FIG. 3 illustrate an example process of performing an erase (ERS) operation or a program (PGM) operation by an octo signal in a test method of an example non-volatile memory device including an octo mode program and erase operations for a test time reduction, in accordance with one or more embodiments. The meaning of various abbreviations described in FIG. 2 and FIG. 3 are as indicated in Table 1 below.

TABLE 1

| Signal name | Description |
|---|---|
| CEB | To enable IP block, Chip Enable, B means low active |
| WRTEN | Write enable signal of a Chip |
| PGMB | Program enable signal, B means low active |
| ERSB | Erase enable signal, B means low active |
| WEB | Write enable signal, B means low active |
| ADD[7:5] | Address, from 5 to 7 |
| Octo Addrj | Octo Address, j is addressing |
| tPGM | Program time |
| tWH | Write hold time |
| tCEH | Chip enable hold time |
| 7 H | Hexa 7, TEST<2:0> = 111 |
| tWS | Write set-up time |
| tWCES | Chip write enable set-up time |

Referring to FIG. 2 and FIG. 3, in an example, TEST<2:0> is a control signal generated in the control logic device 120, and based on the TEST<2:0> signal, an ALL signal, an ODD signal, an EVEN signal and/or an OCTO signal may be delivered to the address decoder 130 to control the address decoder 130. Each condition of the TEST<2:0> mode is described with reference to Table 2 below.

TABLE 2

| MODE | STATE | TEST[2:0] | REB | WEB | LDEB | ERSB | PGMB |
|---|---|---|---|---|---|---|---|
| Normal mode | X | L L L | X | X | X | X | X |
| Erase verify | READ | L L H | L | H | H | H | H |
| Program verify | READ | L H L | L | H | H | H | H |
| All Row | Erase/PGM | L H H | H | L | H | L/H | H/L |
| Odd Row | Erase/PGM | H L L | H | L | H | L/H | H/L |
| Even Row | Erase/PGM | H L H | H | L | H | L/H | H/L |
| Octo Row | Erase/PGM | H H H | H | L | H | L/H | H/L |

Referring to Table 2, REB refers to a Read enable signal, WEB refers to a Write enable signal, LDEB refers to a Load enable signal, ERSB refers to an Erase enable signal, and PGMB refers to a Program enable signal. In the examples, B refers to low (L) active. L refers to setting low, and H refers to setting high. In an example, when REB is set as H, it becomes inactive. When WEB is set as L, a WEB signal becomes active.

FIG. 2 illustrates an example process of performing an erase (ERS) operation based on an octo signal in an example test method of a non-volatile memory device including an octo mode program and erase operation for a test time reduction, in accordance with one or more embodiments.

Referring to FIG. 2, an octo array erase mode may be controlled only by a Write enable signal (WEB) and an ERSB (Erase enable signal) input signal. A test bit (TEST [2:0]) may be set as 7H. By setting a test bit (TEST[2:0]) as a logic 7H, a selected page (64 Kbit) may be erased all at once. A page selected by ADD[7:5] may be erased simultaneously.

In an octo array erase mode, a control input signal: reset signal (RSTB), Power down enable signal (PDB), Read enable signal (REB), Load enable signal (LDEB) and Page buffer reset signal (PGMB) may remain as a high.

By designating an input signal Write enable (WEB) as a low, an octo array erase mode may be started. When an Erase enable signal (ERSB) input signal is activated, an octo array erase mode may be started from a falling edge of a WEB for an octo array. During an octo array erase mode, WEB and ERSB may be designated as a low and activated. Normally, an octo array erase mode may last for 2.5 ms. To complete an octo array erase mode, a WEB and ERSB input signal may be designated, and marked as a high.

FIG. 3 illustrates a process of performing a program (PGM) operation by an octo signal in an example test method of an example non-volatile memory device including an octo mode program and erase operation for a test time reduction, in accordance with one or more embodiments.

Referring to FIG. 3, a program operation only programs "1" data of a page buffer that is currently selected. A page address (ADD[13:5]) and a column address (ADD[4:0]) may be designated separately, such as in an erase operation.

Referring to FIG. 3, a program operation may be controlled by a Write enable (WEB) and a Program enable (PGMB) input signals. While a control input signal: RSTB, PDB, REB, LDEB, and ERSB may remain as a high, a program operation may be started by designating input signals WEB and PGMB as a low. When a PGMB input signal becomes a low, a program operation for a selected page may be started from a falling edge of WEB. A selected page may be latched from a falling edge of a WEB, after a PGMB input signal is marked as a low. During an entire write program operation that normally lasts 2.5 ms, a WEB and PGMB may be designated as a low. To complete a program operation, by designating a PGMB input signal and a WEB input signal as a high, a write cycle execution for a designated address page may be completed.

Referring to FIG. 2 and FIG. 3, for 64 KB EEPROM having 512 word lines (WL) and 1024 columns, memory cells corresponding to 64ea word lines (WL) may be simultaneously erased or programmed by a test method of the disclosure.

Table 3 below illustrates an octo address (ADD [7:5]).

TABLE 3

| Test[2:0] | Octo page | ADD[7:5] | Octo pages |
|---|---|---|---|
| 7 h | 0 | 0 h | Page[0:504:8], 0, 8, 16, 24, . . . , 480, 488, 496, 504 |
|  | 1 | 1 h | Page[1:505:8], 1, 9, 17, 25, . . . , 481, 489, 497, 505 |
|  | 2 | 2 h | Page[2:506:8], 2, 10, 18, 26, . . . , 482, 490, 498, 506 |
|  | 3 | 3 h | Page[3:507:8], 3, 11, 19, 27, . . . , 483, 491, 499, 507 |
|  | 4 | 4 h | Page[4:508:8], 4, 12, 20, 28, . . . , 484, 492, 500, 508 |
|  | 5 | 5 h | Page[5:509:8], 5, 13, 21, 29, . . . , 485, 493, 501, 509 |
|  | 6 | 6 h | Page[6:510:8], 6, 14, 22, 30, . . . , 486, 494, 502, 510 |
|  | 7 | 7 h | Page[7:511:8], 7, 15, 23, 31, . . . , 487, 495, 503, 511 |

Referring to Table 3, an octo page is defined from 0 to 7. 64 word lines (page) may be simultaneously selected for each page. In an example, when an octo page is 0, page 0, page 8, . . . , page 504 are selected, and memory cells corresponding to 64ea word lines may be simultaneously erased or programmed. Octo rows corresponding to 0, 8, 16, 24, . . . , 480, 488, 496, 504 may be selected for a write operation.

Additionally, when an octo page is 1, page 1, page 9, . . . , page 505 may be selected, and memory cells corresponding to 64ea word lines may be simultaneously erased or programmed. Octo rows corresponding to 1, 9, 17, 25, . . . , 481, 489, 497, 505 may be selected for a write operation. Accordingly, a write operation may be performed such as an erase or program operation for 512 rows in total.

Table 4 below illustrates a cell bias condition for a page program operation, page erase operation, and read operation of an EEPROM, in accordance with one or more embodiments.

TABLE 4

| Mode | Selected WL | Un-selected WL | Selected BL | Un-selected BL | HPW | HDNW |
|---|---|---|---|---|---|---|
| Page Program | VPP(16.5 V) | 0 V | 0 V | 9 V | 0 V | 0 V |
| Page Erase | 0 V | 13.5 V | Float | Float | 13.5 V | 13.5 V |
| Read | 3.0 V | 0 V | 0.6~1.2 V | Float | 0 V | 0 V |

In an example, for a page program operation, a program voltage 16.5V (VPP) may be applied to a word line (WL) of a selected cell. Additionally, for a page program operation, 0V may be applied to bit line (BL) of a selected cell. 0V and 9V may be applied respectively to a word line and a bit line of an unselected cell. 0V may be applied to a high voltage P-type well (HPW) and a high voltage deep N-type well (HDNW) respectively. According to an example, a HDNW may be formed in a substrate, and a HPW may be formed inside a HDNW. A tunneling gate dielectric, a floating gate, an ONO insulating dielectric layer, and a control gate may be formed on a HPW.

Herein, a word line (WL) may be electrically connected to a control gate of a non-volatile memory cell (NVM memory cell), and a bit line (BL) may be electrically connected to a drain region of a NVM memory cell.

In an example, for a page erase operation, an erase voltage 0V may be applied to a word line of a selected cell. 13.5V may be applied to a word line of an unselected cell. Selected and unselected bit lines may be floated.

Figures 4A, 4B, 4C:
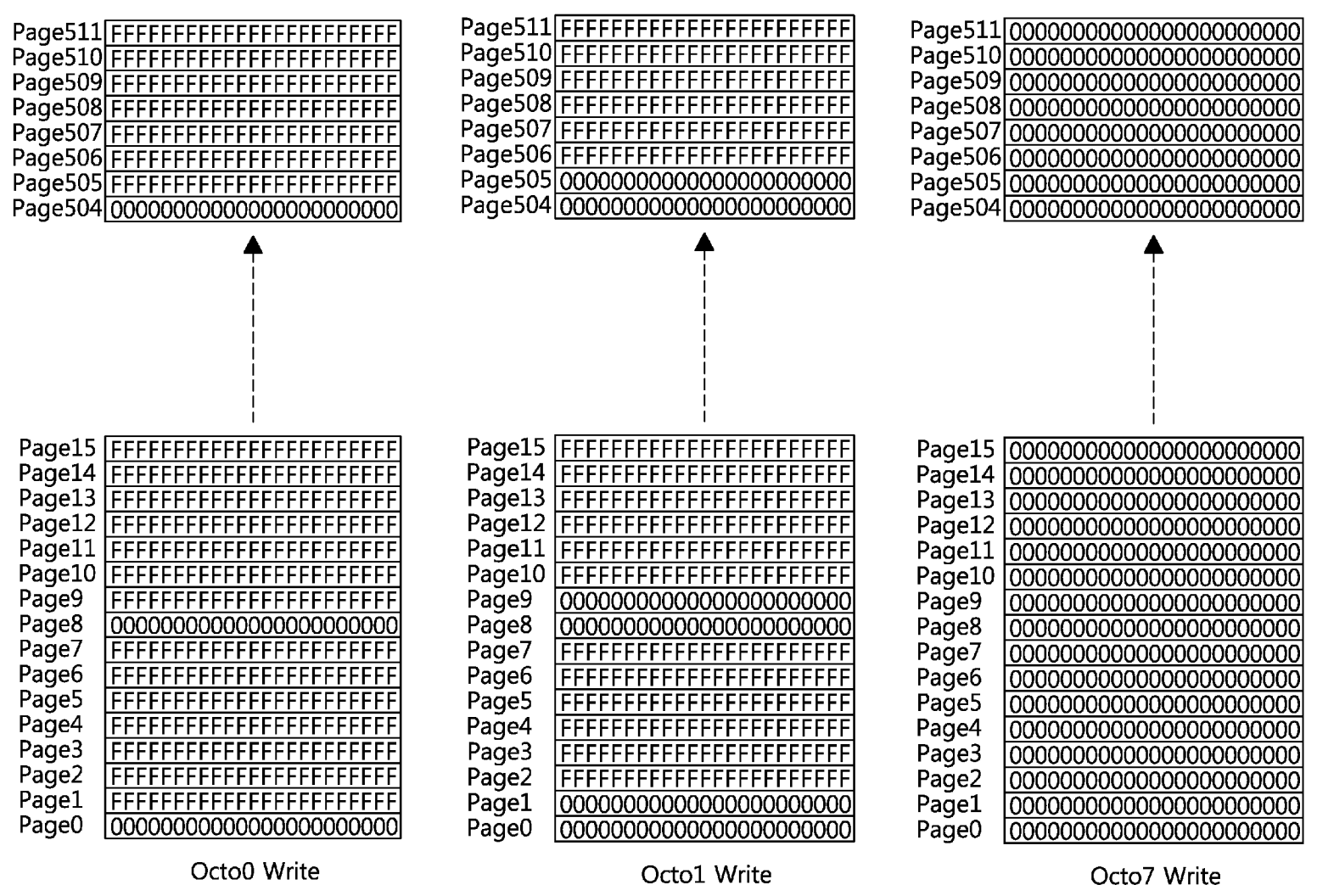

FIGS. 4A to 4C illustrate diagrams of implementations of an erase operation by an octo signal in an example test method of an example non-volatile memory device including an octo mode program and erase operation for a test time reduction, in accordance with one or more embodiments.

Referring to FIGS. 4A-4C, in a 64 KB EEPROM having 512 word lines (WL) and 1024 bit lines (BL), an erase operation by an octo signal may be performed by implementing an example test method. 1024 cells may be arranged in a column for a 64 KB EEPROM. There are 1024 cells in each page. One word line is connected to 1024 bit lines, and 1 bit line is connected to 512 word lines. When it is assumed that a memory cell array composes M word lines and N bit lines, for 64 KB EEPROM, M is 64*8=512, and N is 1024. 1024 cells are arranged widthwise in each page. Pages may exist from 0 to 511 pages. Therefore, M−1 page may become the maximum page.

When inputting an octo signal, memory cells corresponding to an octo row may be selected. Like 0, 8, 16, 324, 32, . . . , 504, etc., 0, 8, 16, 324, 32, . . . , 504 page or 0, 8, 16, 324, 32, . . . , 504 word line, which are multiples of 8, may be selected. That is, M/8=512/8=64 word lines or pages may be simultaneously selected. A write voltage, as illustrated in Table 4 above, may be applied to memory cells connected to a selected word line. In an example, in a program operation, 16.5V may be applied to a selected cell. In an erase operation, 0V may be applied to a selected cell. Additionally, a voltage that is different from a write voltage may be applied to memory cells connected to an unselected word line, which is 0V or 13.5V.

More specifically, referring to FIG. 4A, in Octo0 write, page 0, page 8, . . . , page 504 may be selected, and simultaneously, memory cells corresponding to 64ea word lines (WL) may be erased.

Additionally, referring to FIG. 4B, in Octo1 write, page 1, page 9, . . . , page 505 may be selected, and simultaneously, memory cells corresponding to 64ea word lines (WL) may be erased.

Additionally, referring to FIG. 4C, after successively going through 2 to 6 write by an identical process, in Octo7 write, page 7, page 15, . . . , page 511 may be selected, and simultaneously, memory cells corresponding to 64ea word lines (WL) may be erased.

In FIGS. 4A-4C, "FFFF**" or "0000**" are illustrated. In the examples, 'F' refers to an unselected cell and a programmed state. Number '0' refers to an erase operation of a selected cell. All 1024 cells start with a programmed state in the beginning.

For a page erase operation, an erase voltage 0V may be applied to a word line (page) of a selected cell. 13.5V may be applied to a word line of an unselected cell. When there is a metal particle on word lines of opposite sides, 6-7V may be applied to a word line as an erase voltage, which is a median value. In that example, it may not be possible to perform an erase operation, and a cell may be considered as a fail. A selected word line and unselected word line may become short in an erase operation, and they may be in a state that an erase voltage is not applied.

Likewise, for a program operation, a program voltage 16.5V may be applied to a word line of a selected cell. 0V may be applied to a word line of an unselected cell. When there is a metal particle on word lines of opposite sides, 8-9V may be applied to a word line as a program voltage, which is a median value. In that example, it may not be possible to perform a program operation, and a cell may be considered as a fail. A selected word line and unselected word line may become short in a program operation, and they may be in a state that a program voltage is not applied.

When there is a huge metal particle, it may be formed from page 0 to page 9. When an erase operation test or a program operation test is conducted by selecting a word line per octo (multiples of 8), it may be easy to check a fail.

The examples may perform a program/erase operation in a word line selected in an octo mode, by generating an octo signal through an internal logic. However, an opposite state may appear in a peripheral, unselected word line. When a metal particle falls on a selected word line and unselected word line, they may be shorted. A program/erase (PGM/ERS) operation may not be performed normally. Likewise, it may be possible to determine whether there is a fallen metal particle.

According to the examples, by performing a program/erase (PGM/ERS) operation by selecting word lines in multiples of 8 among a plurality of word lines of a memory cell array 110, it may be possible to precisely screen a fail chip due to a particle or poly residue. Additionally, a test time may be considerably reduced.

Further, a test cost may be considerable reduced to detect a failed chip based on particle or poly residue.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, comprising:
a memory cell array comprising M word lines and N bit lines;
a control logic device, configured to receive an external signal, and output an octo signal, a program signal and an erase signal;
an address decoder, configured to receive the octo signal, and output a word line selection signal and a bit line selection signal;
a high voltage generator, configured to receive the program signal and the erase signal, and output a read voltage and a write voltage;
a row decoder, configured to receive the word line selection signal, and select a word line of the memory cell array;
a column decoder, configured to receive the bit line selection signal, and select a bit line of the memory cell array;
a page buffer, configured to receive the read voltage and the write voltage, and save data to be programmed; and
a data latch, configured to save read data obtained from a read operation;
wherein the non-volatile memory device is configured to simultaneously select non-contiguous word lines that are located every eighth word line among the M word lines and correspond to octo rows in response to the octo signal being applied to the address decoder,
wherein a write voltage is configured to be applied to memory cells connected to the word lines corresponding to the octo rows, and
wherein a voltage that is different from the write voltage is configured to be applied to memory cells connected to word lines, except for the word lines corresponding to the octo-rows.

2. The non-volatile memory device of claim 1, wherein the data latch is further configured to receive write data, and output read data.

3. The non-volatile memory device of claim 1, wherein the non-volatile memory device is configured to perform a write operation of a FN tunneling method.

4. The non-volatile memory device of claim 1, wherein the memory cell array comprises a 64 KB EEPROM which has 512 word lines.

5. The non-volatile memory device of claim 1, wherein the control logic device is further configured to generate a signal to select set of 16 word lines among a plurality of word lines of the memory cell array.

6. The non-volatile memory device of claim 1, wherein the control logic device is further configured to generate a signal to select a set of 32 word lines among a plurality of word lines of the memory cell array.

7. A non-volatile memory device test time reduction method, the method comprising:
transmitting an octo signal from a control logic device to an address decoder;
transmitting the octo signal from the address decoder to a row decoder;
transmitting the octo signal from the row decoder to a memory cell array;
simultaneously selecting non-contiguous word lines that are located every eighth word line among the M word lines of the memory cell array and correspond to octo rows in response to the octo signal being applied to the address decoder; and
performing a write operation simultaneously in memory cells connected to the word lines corresponding to the octo rows.

8. The method of claim 7, further comprising delivering a write signal from the control logic device to a high voltage generator.

9. The method of claim 8, further comprising supplying a write voltage from the high voltage generator to the memory cell array.

10. The method of claim 9, wherein the write operation is performed by supplying the write voltage to a memory cell connected to the word lines corresponding to the octo rows.

11. The method of claim 10, further comprising applying a voltage that is different from the write voltage to a memory cell that is not connected to the word lines corresponding to the octo rows.

12. The method of claim 8, wherein the write operation comprises an octo array erase mode, and
wherein the octo array erase mode is controlled by a write enable signal (WEB) and an erase enable signal (ERSB) supplied from the control logic device.

13. The method of claim 8, wherein the write operation comprises an octo array program mode, and
wherein the octo array program mode is controlled by a write enable signal (WEB) and a program enable signal (PGMB) supplied from the control logic device.

14. A non-volatile memory device, comprising:
a memory cell array comprising M word lines and N bit lines;
a control logic device, configured to output an octo signal, a program signal, and an erase signal;
an address decoder, configured to receive the octo signal, and output a word line selection signal and a bit line selection signal; and
a high voltage generator, configured to receive the program signal and the erase signal, and output a read voltage and a write voltage;
wherein the non-volatile memory device is configured to select non-contiguous word lines that are located every eighth word line among the M word lines of the memory cell array and correspond to octo rows in response to the octo signal being applied to the address decoder.

15. The non-volatile memory device of claim 14, wherein the non-volatile memory device is further configured to apply the write voltage to memory cells connected to the word lines corresponding to the octo rows, and configured to apply a voltage different from the write voltage to memory cells connected to word lines other than the word lines corresponding to the octo rows.

* * * * *